(12) United States Patent
Andersson et al.

(10) Patent No.: US 10,318,664 B2
(45) Date of Patent: Jun. 11, 2019

(54) DETERMINING LIFE CONSUMPTION OF A MECHANICAL PART

(75) Inventors: Magnus Andersson, Trollhattan (SE); Fredrik Wanman, Trollhattan (SE); Peter Svensson, Trollhattan (SE)

(73) Assignee: GKN Aerospace Sweden AB, Trollhattan (SE)

( * ) Notice: Subject to any disclaimer, the term of this patent is extended or adjusted under 35 U.S.C. 154(b) by 465 days.

(21) Appl. No.: 14/407,631

(22) PCT Filed: Jun. 19, 2012

(86) PCT No.: PCT/SE2012/000093
§ 371 (c)(1),
(2), (4) Date: May 8, 2015

(87) PCT Pub. No.: WO2013/191593
PCT Pub. Date: Dec. 27, 2013

(65) Prior Publication Data
US 2015/0234951 A1  Aug. 20, 2015

(51) Int. Cl.
*G06F 17/50* (2006.01)
*G07C 3/00* (2006.01)
*G07C 5/08* (2006.01)
*B64D 45/00* (2006.01)
*G05B 23/02* (2006.01)
(Continued)

(52) U.S. Cl.
CPC .......... *G06F 17/5009* (2013.01); *F01K 13/02* (2013.01); *G05B 23/0283* (2013.01); *G06F 17/18* (2013.01); *G07C 3/00* (2013.01); *G07C 5/0808* (2013.01); *B64D 2045/0085* (2013.01)

(58) Field of Classification Search
CPC .............................. G06F 17/5009; G06F 17/18
See application file for complete search history.

(56) References Cited

U.S. PATENT DOCUMENTS

| 3,588,265 A | 6/1971 | Berry |
| 4,215,412 A | 7/1980 | Bernier |

(Continued)

FOREIGN PATENT DOCUMENTS

| EP | 2390742 A1 | 11/2011 |
| EP | 2434362 A2 | 3/2012 |

OTHER PUBLICATIONS

International Search Report for PCT/SE2012/000096 dated May 2, 2013 (5 pages).

(Continued)

*Primary Examiner* — Rehana Perveen
*Assistant Examiner* — Steven W Crabb
(74) *Attorney, Agent, or Firm* — Bejin Bieneman PLC

(57) ABSTRACT

A first set of data is received relating to the operation of a first mechanical part. A plurality of steady state conditions for the first set of operational data is determined. A load history is determined for the first mechanical part based on the plurality of determined steady states and the first set of operational data. One of a plurality of predefined life consumption calculation models is selected based on a type of the first mechanical part and a position of a critical area at the first mechanical part. A level of life consumption for the critical area of the first mechanical part is determined based on the selected life consumption calculation model and the determined load history.

19 Claims, 3 Drawing Sheets

(51) Int. Cl.
  *G06F 17/18* (2006.01)
  *F01K 13/02* (2006.01)

(56) References Cited

U.S. PATENT DOCUMENTS

| | | | |
|---|---|---|---|
| 5,210,704 A * | 5/1993 | Husseiny | G01H 1/003 |
| | | | 702/34 |
| 6,301,970 B1 * | 10/2001 | Biggs | G06F 17/5018 |
| | | | 73/789 |
| 6,774,786 B1 | 8/2004 | Havekost | |
| 7,149,657 B2 * | 12/2006 | Goebel | G06Q 10/06 |
| | | | 700/108 |
| 7,197,430 B2 | 3/2007 | Jacques et al. | |
| 8,082,115 B2 | 12/2011 | Bechhoefer et al. | |
| 2006/0243055 A1 * | 11/2006 | Sundermeyer | G01N 3/32 |
| | | | 73/760 |
| 2007/0198215 A1 | 8/2007 | Bonanni | |
| 2008/0040152 A1 | 2/2008 | Vian et al. | |
| 2009/0254286 A1 | 10/2009 | Tulyani | |
| 2009/0306909 A1 | 12/2009 | Mattes | |
| 2011/0060568 A1 | 3/2011 | Goldfine | |
| 2011/0106510 A1 * | 5/2011 | Poon | G05B 23/0254 |
| | | | 703/2 |
| 2011/0137575 A1 | 6/2011 | Koul | |
| 2012/0051911 A1 * | 3/2012 | Baik | G01M 5/0016 |
| | | | 416/61 |
| 2012/0101706 A1 | 4/2012 | Masse et al. | |

OTHER PUBLICATIONS

Written Opinion of the International Searching Authority for PCT/SE2012/000096 dated May 2, 2013 (6 pages).
International Search Report for PCT/SE2012/000094 dated May 2, 2013 (5 pages).
Written Opinion of the International Searching Authority for PCT/SE2012/000094 dated May 2, 2013 (8 pages).
International Search Report for PCT/SE2012/000093 dated May 2, 2013 (5 pages).
Written Opinion of the International Searching Authority for PCT/SE2012/000093 dated May 2, 2013 (7 pages).
International Search Report for PCT/SE2012/000095 dated May 2, 2013 (5 pages).
Written Opinion of the International Searching Authority for PCT/SE2012/000095 dated May 2, 2013 (7 pages).
Pfoertner, H. "The information content of turbine engine data—a chance for recording-based life usage monitoring", Aerospace Conference Proceedings, 2002. IEEE Piscataway, NJ, USA, Mar. 9-16, 2002, vol. 6, p. 2975-2985. Publication date Mar. 9, 2002. ISBN 978-0-7803-7231-3; ISBN 0-7803-7231-XS.
Iyyer; Sarkar N; Merrill S; Phan R; N, "Aircraft life management using crack initiation and crack growth models—P-3C Aircraft experience" International Journal of Fatigue, vol. 29, No. 9-11, p. 1584-1607 (2007). Butterworth Scientific Ltd, Guildford, GB. Publication date Aug. 23, 2007. ISSN 0142-1123 doi: 10.1016/j.ijfatigue.2007.03.017.
Papzian J M; Anagnostou E L J; Engel S; Fridline D; Hoitsma D; Madsen J; Nardiello J; Silberstein R P; Welsh G; Whiteside J B, "SIPS, A Structural Integrity Prognosis System, "Aerospace Conference, 2007 IEEE, Piscataway, NJ, USA (Ed.Le Pera A; Forni F; Grossi M; Lucente M; Palma V; Rossi T; Ruggieri M), p. 1-10, Publication date: Mar. 3, 2007, ISBn 978-1-4244-0524-4; ISBN 1-4244-0524-6.
Kadhim N A ; Abdullah S; Ariflin A K, "Effective strain damage model associated with finite element modelling and experimental validation," International Journal of Fatigue, vol. 36, No. 1, 194-205 (2011). Publication date Jul. 18, 2011. ISSN 0142-1123, doi: 10.1016/j.ijfatigue.2011.07.012.
International Preliminary Report on Patentability for PCT/SE2012/000096 dated Dec. 31, 2014 (7 pages).
International Preliminary Report on Patentability for PCT/SE2012/000094 dated Dec. 31, 2014 (10 pages).
International Preliminary Report on Patentability for PCT/SE2012/000093 dated Dec. 31, 2014 (8 pages).
International Preliminary Report on Patentability for PCT/SE2012/000095 dated Dec. 31, 2014 (8 pages).
Abbas_2009 (A System-Level Approach to Fault Progression Analysis in Complex Engineering Systems, Annual Conference of the Prognostics and Health Management Society, 2009).
Singh_2005 (Assessing Useful Life of Turbomachinery Components, Proceedings of the Thirty-Fourth Turbomachinery Symposium, 2005).
Inman_2005 (Damage Prognosis for Aerospace, Civil and Mechanical Systems, John Wiley & Sons, Ltd. 2005).
Non-Final Office Action dated Jun. 16, 2017 for U.S. Appl. No. 14/407,628 (51 pages).
Non-Final Office Action dated Aug. 16, 2017 for U.S. Appl. No. 14/407,634 (16 pages).
Bogard_2011 (Numerical Modeling of Fatigue Damage and Fissure Propagation under Cyclic Loadings, International Journal of Damage Mechanics, SAGE Publications, 2008, 174 (2), pp. 173-187. <10.1177110567895080889961>. <hal-00571173>).
LeVeque_2005 (Finite Difference Methods for Differential Equations, AMath 585-586 University of Washington Version of Sep. 2005).
Non-Final Office Action for U.S. Appl. No. 14/407,623 dated Feb. 7, 2018 (78 pages).
PAControl_2006 (Instrumentation & Control: Process Control Fundamentals, 2006, downloaded from www.PAControl.com).
Control_Loop_Wiki (Control Loop Defined, Wikipedia, downloaded from https://en.wikipedia.org/wiki/Control_loop).
Lee_1999 (Computer-aided Maintenance: Methodologies and Practices, Springer US, 1999).
Ray_1994 (Fatigue damage control of mechanical systems, Smart Mater, STruct. 3 (1994) 47-58. UK.
Final Office Action dated Dec. 27, 2017 for U.S. Appl. No. 14/407,628 (39 pages).

\* cited by examiner

DETERMINING LIFE CONSUMPTION OF A MECHANICAL PART

CROSS-REFERENCE TO RELATED APPLICATION

This application is a National Phase of, and claims priority to, International Application No. PCT/SE2012/000093 filed on Jun. 19, 2012, of which application is hereby incorporated herein by reference in its entirety.

BACKGROUND

Today, there is significant interest in the prediction of the life consumption of individual components in a machine, in particular machines with moving parts, where the term life consumption may be defined as the amount of damage the component may endure without failure. By improving the accuracy of such methods, the applied safety limits may be reduced, and unnecessary replacement of components may be avoided. When applied to an entire fleet (e.g., a military aircraft fleet) the cost savings may be significant as well as allow for an increased operational lifetime. Furthermore, in the unusual event that conventional methods are too optimistic, refined methods may avoid failure of components, thus avoiding uncalculated stops in operation or, even more importantly, accidents.

Examples of interesting applications where improved life consumption predictions may be useful include aircrafts, gas/steam turbines, trucks, loaders, nuclear plants and wind turbines.

A conventional method for predicting the life consumption of a component in a machine is to measure one or a combination of the usage/run time, distance, or count the number of cycles of a predefined load session, or a conservative load session. A load session is the time when the machine is in operation, for example for an aircraft a load session may be defined as flying from point A to point B with a predefined rotor speed variation.

In the field of aircrafts, the life consumption of an engine is sometimes determined by making a "simplified" cycle count, focusing on the usage of a specific engine component. There are also available more specific and at least in some sense more reliable methods where, e.g., ELCF (equivalent low cycle fatigue) cycles for the specific, for example, engine component is determined. Such ELCF cycles may for example be calculated based on the high pressure rotor speed of an aircraft jet engine recorded during a load session. The cycles may be determined by the number of times the high pressure rotor speed exceeds certain selected and predefined rotor speeds. Furthermore, to calculate the ELCF cycles, scale factors are determined for the cycles based on predetermined load sessions. However, a major drawback with ELCF cycles is that the prediction of life consumption will have errors if the actual load sessions experienced by a specific component differs significantly from the predetermined load sessions.

As demands for cost efficiency and reliability increase, the interest in finding better models for predicting life consumption has also increased. This is made specifically apparent as the conventional methods do not take all significant load cycles into consideration. For example, the method of counting ELCF-cycles only considers one engine parameter of the entire engine while the life consumption of the critical components in an engine or machine may vary depending on which loads are most important for the life consumption of respective component.

In order to more accurately determine the life consumption of, e.g., an engine, the life consumption for relevant components in the engine must be determined. In order to determine the life consumption of specific components, more detailed knowledge of conditions in separate parts of the engine is required.

In U.S. Pat. No. 7,197,430, a method is disclosed for determining an engine part life usage of a gas turbine engine life limited part used on an aircraft. The method includes operating a gas turbine engine that includes a plurality of rotating components and a plurality of sensors configured to monitor a plurality of gas turbine engine operating parameters, obtaining outputs from the plurality of sensors, and utilizing at least some of the outputs to calculate the life usage of at least one life limited part to facilitate tracking the life-usage of an individual life limited part on the gas turbine engine that is consumed on a flight by flight basis.

Although providing an improved life consumption calculation in comparison to the prior art method of using ELCF cycles, the solution provided in U.S. Pat. No. 7,197,430, still lacks a way for handling a complete flight mission and all thereto related sensor data, i.e., only snapshots of the flight mission when in different conditions are used for determining an alternative cycle count as compared to determining ELCF cycles.

Accordingly, there is still a need for more thoroughly determination of the life consumption of life limited parts, such as for example a mechanical life limited part in an aircraft.

SUMMARY

The present disclosure generally relates to the field of life limited parts, and specifically to a method and system for determining life consumption of a mechanical life limited part.

According to an aspect, a method is disclosed for determining a level of life consumption of a critical area of a first mechanical part, comprising the steps of receiving a first set of data relating to the operation of the first mechanical part, determining a plurality of steady state conditions for the first set of operational data, determining a load history for the first mechanical part based on the plurality of determined steady states and the first set of operational data, selecting one of a plurality of predefined life consumption calculation models based on the type of the first mechanical part and the position of the critical area at the first mechanical part, and determining the level of life consumption for the critical area of the first mechanical part based on the selected life consumption calculation model and the determined load history.

A specifically targeted calculation model may be selected for each mechanical part and the critical area of that part, where the selected life consumption calculation model is adapted to match a predetermined behavior of the mechanical part, and the life consumption calculation models preferably are provided for calculation of e.g., stresses, strains and temperatures of the mechanical component when exposed to a set of loads during its operation. An advantage with such a set-up is, for example, the possibility of optimize each of the plurality of predefined life consumption calculation models in regards to calculation speed, thereby minimizing the calculation time necessary for accurate determination of a level of life consumption of the mechanical part. Hence, put differently, instead of applying a more general calculation model and limiting the number of input parameters, it is possible to use in essence "all" operational data in the calculation but to "simplify" the calculation model as knowledge of the specific mechanical part and its operation may be taken into account during a determination of the "simplified" calculation model.

Following such an optimization, it may be possible to process an increased amount of operational data, as a result even further increasing the reliability of the life consumption calculation. Accordingly, more than one predefined life consumption calculation model may be available for the same critical area (in some embodiments defined as a node of the mechanical component). Thus, based on a targeted accuracy and/or calculation speed, a specific life consumption calculation model may be selected for the specific critical area, where also the number of parameters used by the calculation model may be adjustable.

Within the context of this disclosure, a steady state condition is here referred to as a predetermined machine state, defined as a state of a machine where the mechanical part is comprised, at a specific point in time as defined by the specific values of the operational data. The determined steady state conditions contain steady state load data that is not, e.g., measured in the machine, such as an engine. Rather, that load data have been pre-calculated for all possible machine steady state conditions and are necessary to be able to calculate the total load situation for the mechanical part.

Thereby, it may be possible to more efficiently process sets of operational data by determining matching steady states conditions. Such a matching procedure is generally more time efficient than performing calculations. An additional advantage is that calculations resulting in non-converging solutions can be avoided. In an embodiment, a large plurality of steady state conditions matching specific machine conditions may for example be stored in a database.

Furthermore, a load history should within the context of this disclosure be understood to contain a time history of all the determined steady state conditions based on one single set (e.g., the first) of the measured operational data.

Additionally, in some environments where operational data e.g., coupled to the operation of a machine, is classified, it may be desirable to pass through a process of de-classification of the operational data, for not disclosing performance parameters. For example, when the machine is an aircraft engine and the machine session is a flight mission, it may be desirable to allow a third party to work with operational data for calculating life consumption without revealing mission specific parameters such as aircraft velocity and altitude.

In addition to aircrafts, the machine may be any type of machine such as for example selected from gas/steam turbines, trucks, loaders, nuclear plants and wind turbines. Accordingly, operational data (e.g., the first as well as further sets of the operational data) may for example be generated by at least one sensor arranged in the vicinity of the mechanical part for measuring one of time, power lever angle, altitude, aircraft speed, ambient temperature, inlet temperature, low pressure rotor speed, high pressure rotor speed, combustor pressure, turbine outlet temperature, turbine outlet pressure, control mode of e.g., the machine, such as for an aircraft. In some embodiments, one single set of operational data is referred to as a load session, representing an operational cycle for a machine, for example a flight mission for an aircraft.

In reducing the calculation time necessary for high accuracy determination of the life consumption of the mechanical part for all of its available actual load sessions (e.g., in relation to "all" operations of an aircraft), it may be possible to reduce safety margins for the mechanical part, thus allowing setting a critical limit of the life consumption closer to the predicted life limit of the component. Specifically, as more data realistically may be processed for determining the life consumption, fewer uncertainties are present and less margins are necessary.

Preferably, a plurality of sets of operational data (e.g., the first, a second, a third, etc.) for the first mechanical part is processed using the disclosed method. Accordingly, to achieve a total level of life consumption, which for example may be communicated to a separate system, the life consumptions relating to the different sets of operational data may be accumulated. As understood, the inventive concept is applicable to more than to a single (i.e., first) mechanical part it may also be used for a large plurality of parts of e.g., the same machine.

Accordingly, in an embodiment, the determined level of life consumption may be used in conjunction to an already available life consumption prediction model, such as for example the earlier discussed ELCF cycle determination. Thus, the determined level of life consumption may for example be used for "correcting" the (available) life consumption prediction model (e.g., ELCF), thereby generating a cycle count more correctly matching the operational condition of the mechanical part. Thus, the present method may be used as an "add-on" and used in situations where a more generalized life consumption prediction model is currently implemented. It should be noted that any type of already available life consumption prediction method may be used, including for example methods being based on at least one of measuring the usage time, run time or usage distance of the mechanical part. In such a case, for example in a case where the mechanical part is part of a road vehicle, a life consumption prediction being based on the measured distance travelled may be corrected using the presently disclosed method.

In one embodiment it is not necessary to correct all "sessions" in which the mechanical part is used (e.g., representing the first and a second set of operational data). For example, in case of non-availability of the set of data relating to the operation of the mechanical part, it may be necessary to leave the result of the already available life consumption prediction method "uncorrected". Thus, if implementing the method as an add-on to a maintenance system, it may be useful to keep track of which sessions are being corrected and which are left un-corrected.

The maintenance system may also be used to keep track of different mechanical parts and specific configurations relating to the usage of the mechanical part. As an example, a maintenance system employing the concepts of this disclosure may allow mechanical parts arranged in different configurations, where one specific mechanical part may be transferred between different machines such as for example turbines, engines, etc. Such a possibility allows for further optimization of the usage of the mechanical part.

Preferably, the pluralities of predefined life consumption calculation models are represented by linear part-specific equations corresponding to general non-linear fatigue calculations models. That is, in calculation speed optimizing the life consumption calculation models (e.g., in regards to fatigue) for a specific mechanical part, it is desirable to determine a linear relation matching the behavior for the specific part, in a specific operational condition.

Additionally, the presently-disclosed concept may be used for life consumption determination based on "real" (actual) or "synthetic" (artificial) sets of data relating to the operation of the mechanical part. Put differently, the concept may be used in relation to the general operation of the mechanical part as well as in the design process of the mechanical part, where e.g., synthetic operational data may be used as an input.

According to another aspect, there is provided a system for determining a level of life consumption of a critical area of a first mechanical part, the system comprising a database and a processing unit, wherein the processing unit is configured to receive a first set of data relating to the operation of the first mechanical part, determine a plurality of steady state conditions for the first set of operational data, determine a load history for the first mechanical part based on the plurality of determined steady states and the first set of operational data, select one of a plurality of predefined life consumption calculation models based on the type of the first mechanical part and the position of the critical area at the first mechanical part, and determine the level of life consumption for the critical area of the first mechanical part based on the selected life consumption calculation model and the determined load history.

In an embodiment, the steady state conditions are determined by selecting steady states matching specific sets of operational data from the database. Accordingly and as discussed above, sets of operational data may be used as input provided by the processing unit for identifying best matching steady state conditions available in the database. Features of this aspect provide similar advantages as discussed above in relation to the previous aspect.

According to a further aspect there is provided computer program product comprising a computer readable medium having stored thereon computer program means for causing a processing unit to determine a level of life consumption of a critical area of a first mechanical part, wherein the computer program product comprises code for receiving a first set of data relating to the operation of the first mechanical part, code for determining a plurality of steady state conditions for the first set of operational data, code for determining a load history for the first mechanical part based on the plurality of determined steady states and the first set of operational data, code for selecting one of a plurality of predefined life consumption calculation models based on the type of the first mechanical part and the position of the critical area at the first mechanical part, and code for determining the level of life consumption for the critical area of the first mechanical part based on the selected life consumption calculation model and the determined load history.

The processing unit may preferably be provided in a server or similarly, and the computer readable medium may be one of a removable nonvolatile random access memory, a hard disk drive, a floppy disk, a CD-ROM, a DVD-ROM, a USB memory, an SD memory card, or a similar computer readable medium known in the art.

As above, features of this aspect provide similar advantages as discussed above in relation to the previous aspects.

Further features of, and advantages with, the presently disclosed subject matter will become apparent when studying the appended claims and the following description. The skilled addressee realizes that different features disclosed herein may be combined to create embodiments other than those described in the following, without departing from the scope of the claimed invention.

BRIEF DESCRIPTION OF THE DRAWINGS

The various aspects of the disclosed subject matter, including its particular features and advantages, will be readily understood from the following detailed description and the accompanying drawings, in which.

DETAILED DESCRIPTION OF EXEMPLARY EMBODIMENTS

Figure 1:
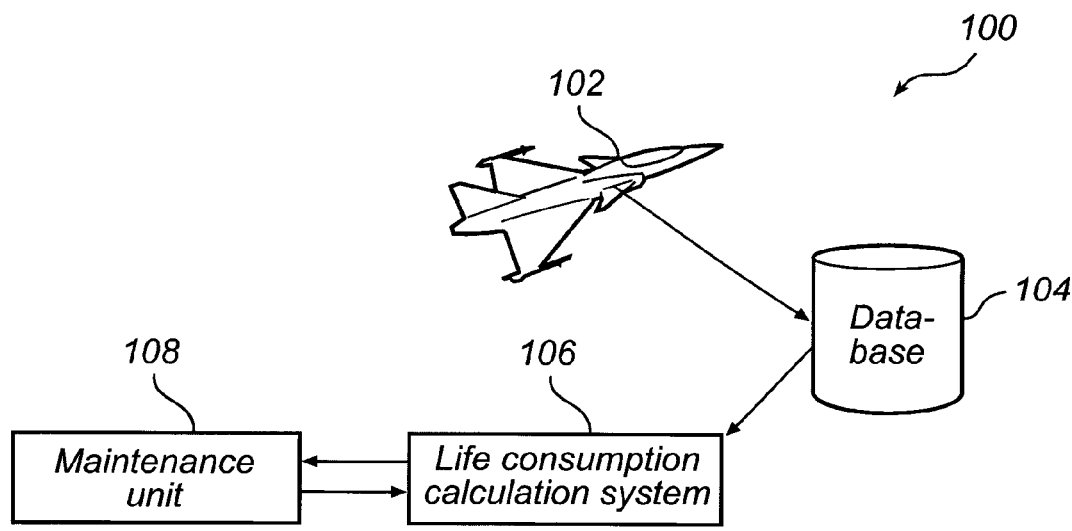
FIG. 1 schematically illustrates an overall maintenance system for an aircraft.

The present subject matter will now be described more fully hereinafter with reference to the accompanying drawings, in which embodiments are shown. The subject matter may, however, be embodied in many different forms and should not be construed as limited to the embodiments set forth herein; rather, these embodiments are provided for thoroughness and completeness, and fully convey the scope of the disclosure to the skilled addressee. Like reference characters refer to like elements throughout. Throughout the present description, the expression mechanical component and mechanical part will be used interchangeable.

FIG. 1 schematically illustrates an overall maintenance system 100 for a machine. In FIG. 1 a fighter aircraft 102 is illustrated as an example of the machine, the fighter aircraft 102 comprising a plurality of mechanical parts out of which some are defined as critical life limited. Of course, other machines are possible and within the scope of the disclosure and may for example be selected from aircrafts (in general), gas/steam turbines, trucks, loaders, nuclear plants and wind turbines.

Figure 2:
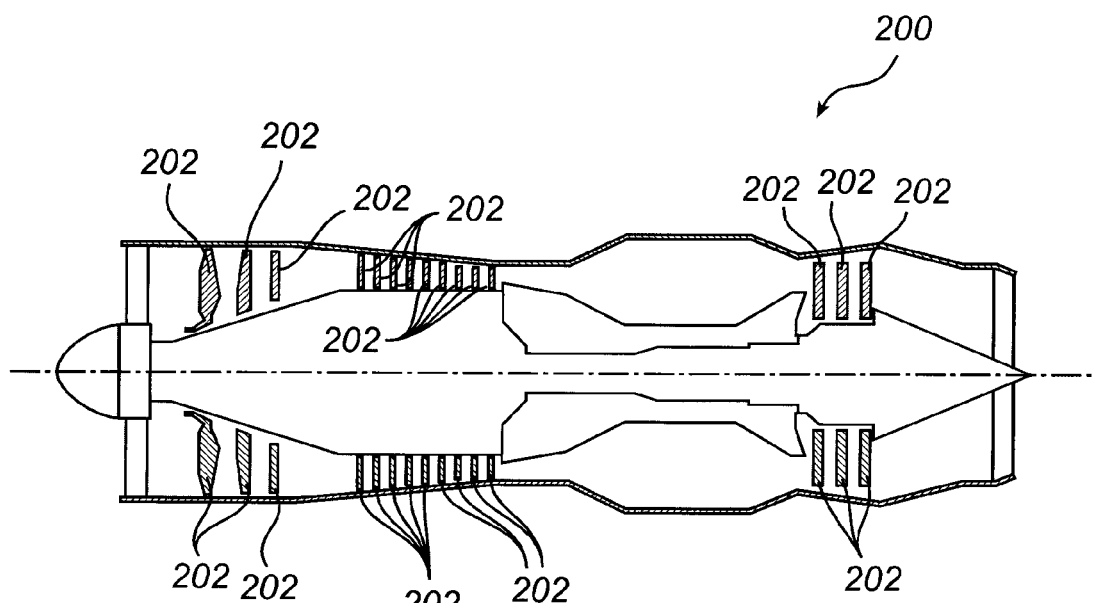
FIG. 2 illustrates a cross-section of a jet engine comprising a number of life limiting components/parts.

In FIG. 2 there is depicted a cross-section of a jet engine 200 comprising of a number of life limiting components 202, the jet engine 200 being specifically exposed to forces that may cause failure to its components/parts. Typically, several of the life limiting components may be rotating components and/or components exposed to high temperatures or other loads. A number of parameters (i.e., operational data) are measured in the jet engine 200 during the time when the machine is in operation (defined as a load session), for example time, power lever angle, altitude, aircraft speed, ambient temperature, inlet temperature, low pressure rotor speed, high pressure rotor speed, combustor pressure, turbine outlet temperature, turbine outlet pressure, control mode of, e.g., the aircraft 102. For the fighter aircraft 102 from FIG. 1, the plurality of operational data is recorded and stored in a computer storage medium (not shown) available on the fighter aircraft 102.

With further reference to FIG. 1, the load sessions with recorded data is transferred, (e.g., wired or wirelessly) to, e.g., a database 104, possibly arranged on the "ground", e.g., separate from the aircraft 102. The data recorded during a flight is referred to as load data from a load session (e.g., corresponding to the first or the second set of operational data). The data stored in the database 104 is used by a life consumption calculation system 106 to predict the life consumption of a component/part of, e.g., the jet engine 200. The accumulated life consumption results may be transferred to a maintenance unit 108. The maintenance unit 108 may, after an indication (e.g., a determination made by the maintenance unit 108) that a component is approaching the end of its useful life, determine a suitable maintenance action. The maintenance action may for example be to service the component or to replace it. When a maintenance action has taken place, information of such an (maintenance) event is sent back (instantly, periodically, after a request, etc.) to the life consumption calculation system 106, for example comprising information as to that the component has been serviced or exchanged for another (e.g., new) component, allowing the life consumption calculation system 106 to adapt its calculations based on the current life consumption state of the component. A (slightly) used component may also be installed, whereas a predicted life consumption adapted for the used component may be transferred from the maintenance unit 108 to the life consumption system 106 in a similar manner.

Figure 3:
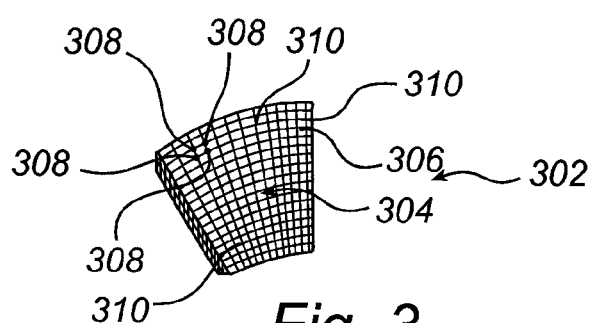
FIG. 3 illustrates a component/part of the jet engine of FIG. 2 with an applied mesh.

FIG. 3 illustrates one of the life limiting components 302 in FIG. 2. A mesh 304 based on a 3D model of the component is also illustrated. The mesh is a grid comprising a number of elements 306, where each corner of the grid is a node 308, each node forming a point. The elements 306 may have other nodes besides the nodes in each corner. A plurality of nodes 310 are selected as being potentially life limiting (i.e., a critical area). Also the potentially life limiting nodes 310 are illustrated in FIG. 3. The mesh 304 generated for the 3D model of the component may be used for analyzing temperature and mechanical stresses on the component 302 by calculating a thermal and mechanical stress pattern with a mesh based numerical method. The thermal and mechanical stress pattern may be calculated by using a finite element analysis method in, e.g., a finite element software. The element size influences the accuracy of the temperature and stress analysis. An increased number of elements 306 for a component improve the accuracy of the calculations.

When the mechanical and thermal loads are calculated, the thermal and mechanical stress pattern will display one zone or a plurality of zones where the mechanical stress and temperature is higher than the surrounding area. The stresses and temperatures are calculated for each point with a thermal and a mechanical load. Furthermore, the mechanical and temperature load within the element 306 may be determined by considering the load from nodes in proximity to the element 306. For example, the mechanical and thermal load within the element loads may be received by averaging the loads of the nodes 308 in proximity to the element.

Figure 4:
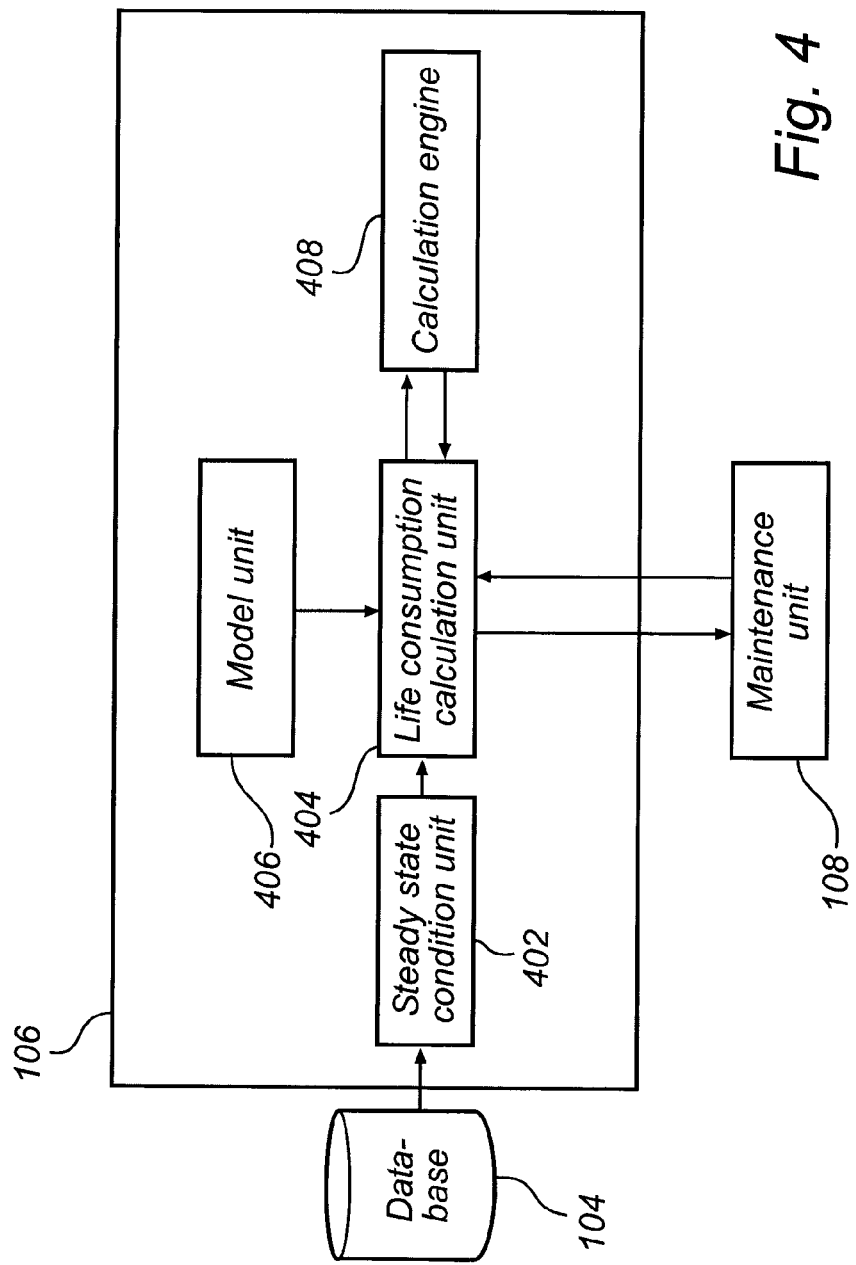
FIG. 4 provides a detailed illustration of a life consumption calculation system according to an exemplary embodiment.

With reference to FIG. 4, there is provided a detailed view of the life consumption calculation system 106 as shown in FIG. 1. The load sessions stored in the database 104 is received by the life consumption calculation system 106, where the data initially is processed by a steady state condition unit 402. For an aircraft, the session may be a flight mission and the measured parameters may include velocity, altitude, ambient temperature, turbine speed, etc. Possibly, the measured parameter values may be verified against predetermined tolerance ranges where values falling outside either may trigger an alert or be removed for manual treatment of the corresponding machine state.

In the steady state condition unit 402, each of the machine states are matched against steady state conditions, for example stored in a thereto related database. The creation of steady state conditions is based on storing machine condition parameters calculated from machine states in operation of the machine. Thereby, instead of performing calculations for each machine state for the operational machine, the resulting steady state conditions may be found by matching measured data from the machine with corresponding predefined sets of parameter values. As stated above, such a matching procedure is generally more time efficient than performing calculations. A machine state is defined as a state of the machine at a specific point in time defined by specific values of the measured data. An additional advantage is that calculations resulting in non-converging solutions may be avoided.

Typically, a subset of the measured parameter values are used for matching to a grid to improve the speed of the matching step and as sufficient accuracy may be achieved even if all measured parameters are not matched. As discussed above, the database is populated by previously measured parameter values corresponding to steady state conditions, thereby forming a grid where each measured parameter corresponds to a dimension in the grid. However, it may not be possible to form a database containing a complete grid, as all possible combinations of parameter values within the grid may not have been possible to calculate. Therefore, interpolation may be performed between grid points corresponding to measured parameter values to populate the database. After all machine states have been matched with their nearest steady state conditions, an output is provided which comprises identifiers of the steady state conditions. The output may typically be comprised in a file comprising steady state condition identifiers vs. time. The output may also comprise measured load data and metadata which identifies the mission and/or the engine and engine components.

Based on the resulting steady state conditions, machine condition parameters are retrieved, possibly also from a related database, for each of the steady state condition identifiers. Machine condition parameters typically comprise calculated pressures, mass flows, temperatures, torques etc. for different positions in the engine and relating to various components of the engine. Thousands of parameters may be required for accurately calculating a life consumption of individual components in the, e.g., engine, turbine, etc. Based on the provided machine condition parameters and measured load data, thermal and mechanical loads (i.e., load histories) can be calculated as a step in determining the life consumption of components resulting from a specific load session.

The preprocessed data from the steady state condition unit 402 is then transferred to a life consumption calculation unit 404. The life consumption calculation unit 404 is arranged to receive steady state conditions, calculate a load history, and to apply the load history to a selected one of a plurality of life consumption models. In the illustrated embodiment, the life consumption models are determined in a model unit 406.

The model unit 406 develops and determines the life consumption models. The virtual models used in the product development phase may be used to create the life consumption models. The validated life consumption models calculate the predicted life consumption with the calculation engine for artificial load sessions. The validated life consumption models are developed further for available actual load sessions. Actual load data from load sessions may be obtained by performing actual flight missions in a test environment or by flight missions where, e.g., the aircraft is provided with further sensors allowing numerous parameters (further then what is normal during the general operation of an aircraft) to be measured. Based on a thorough analysis the reliability limits and the safety factor are determined for the life consumption model. After this step, the life consumption model is reviewed and is validated if it is found to work properly. The validated life consumption model for actual load data is then ready to be used in operation.

Additionally, it should be noted that the life consumption models may be used to further develop and redesign components by evaluating the predicted life consumption for predefined load sessions. Also, the life consumption models may continuously be updated, when an improved model has been developed. By recalculating the load data from the load session with the updated life consumption model the life consumption will be updated.

As stated above, the selected one of the plurality of life consumption models are arranged to match a predetermined behavior of the mechanical component/part. Accordingly, a specifically targeted calculation model may be selected for each mechanical part and possibly critical area (node) of that part. An advantage with such a set-up is for example the possibility of optimize each of the plurality of predefined life consumption calculation models in regards to calculation speed, thereby minimizing the calculation time necessary for accurate determination of a level of life consumption of the mechanical part. Following such an optimization, it may be possible to process an increased amount of operational data (for example by allowing calculations for further nodes within the same part), as a result even further increasing the reliability of the life consumption calculation. Also, more than one life consumption model may be available for the same component/part. Thus, based on a targeted accuracy and/or calculation speed, a specific life consumption calculation model may be selected, also allowing the number of parameters used by the calculation model to be adjustable.

In an exemplary implementation of the life consumption calculation system 106, the specifically selected targeted calculation model and the corresponding preprocessed load sessions are transferred from the life consumption calculation unit 404 to a calculation engine 408 (possibly being a clustered server environment), where a predicted life consumption may be calculated. Additionally, the life consumption models may include settings used by the calculation engine 408, where the models, e.g., may be stored as XML-files. The parameters may include part number, safety factors, material data, filter settings, thermal model settings, stress model settings, failure mode settings and reliability limits. The failure mode settings and material data may include data regarding the material of the component and properties of the data gathered from, e.g., test environments where further data is collected.

The life consumption calculation unit 404 receives the results from the calculation engine 408 and stores the predicted life consumption. The maintenance unit 108 is provided with accumulated predicted life consumption from the life consumption calculation unit 404 when all desired actual load sessions have been calculated. When a maintenance action has taken place, information regarding this action in the maintenance unit 108 may be sent to the life consumption calculation unit 406. If a component is replaced, the stored data of the life consumption for that particular component is adjusted.

The life consumption calculation system 106 may be realized as a combination of hardware and software elements. In particular, any or all of the blocks 402-408 may be realized by computer program code executed by one or several processing units. The processing units may form part of a larger computer server system or comprise a network of interconnected processors. The computer program code may be stored on a computer readable medium such as a removable nonvolatile random access memory, a hard disk drive, a floppy disk, a CD-ROM, a DVD-ROM, a USB memory, an SD memory card, or a similar computer readable medium known in the art.

Figure 5:
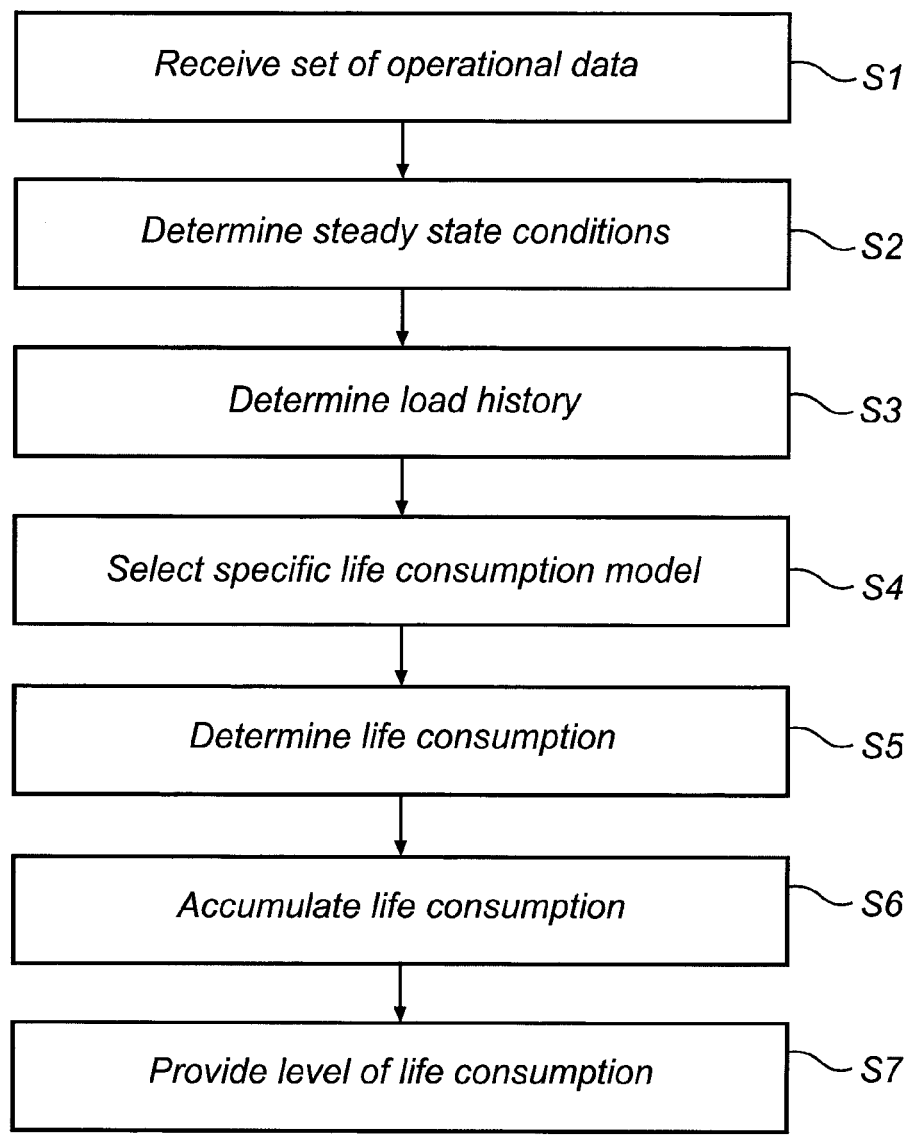
FIG. 5 illustrates a flow chart for performing the method according to an embodiment.

In summary, and with reference to FIG. 5, in one currently preferred embodiment of the invention the steady state condition unit 402 receives, S1, a first set of data (for example data relating to a first flight mission) relating to the operation of the selected mechanical part, e.g., being a component/part of the jet engine 200 of the fighter aircraft 102. Then, the steady state condition unit 402 determines, S2, a plurality of steady state conditions for the first set of operational data. Based on the resulting steady states and the operational data, a load history for the mechanical part is determined, S3, for the plurality of determined steady states and the first set of operational data.

Next, the life consumption calculation unit 404 selects, S4, one of a plurality of predefined life consumption calculation models, depending of the type of mechanical part and the positioning of the critical area at the mechanical part. Then, it is determined, S5, a life consumption for the critical area of the mechanical part based on the selected life consumption calculation model and the load history. Following, a second set of operational data (for example relating to a second flight mission) is received for the same mechanical part and a similar determination as to the life consumption is made. Thereafter, the (in this example being two, in a general implementation of course being a large plurality) life consumptions are accumulated, S6, for determining a total level of life consumption for the critical area of the mechanical part.

The resulting total level of life consumption for the critical area is then provided, S7, by the life consumption calculation unit 404 to the maintenance unit 108, where adequate handling of maintenance of the mechanical part is made possible.

By means of the inventive concept, it is possible to reduce the calculation time necessary for high accuracy determination of the life consumption of the mechanical part for all of its available actual load sessions, allowing for the reduced safety margins for the mechanical part, thus allowing setting a critical limit of the life consumption closer to the predicted life limit of the component.

Even though the presently disclosed subject matter has been described with reference to specific exemplifying embodiments thereof, many different alterations, modifications and the like will become apparent for those skilled in the art. Variations to the disclosed embodiments can be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A method, comprising: measuring a first set of operational data relating to the operation of a first mechanical part;
receiving the first set of data relating to the operation of the first mechanical part; determining a plurality of steady state conditions for the first set of operational data by matching measured data with corresponding predefined sets of parameter values;
determining a load history for the first mechanical part based on the plurality of determined steady states and the first set of operational data;
selecting one of a plurality of predefined life consumption calculation models based on a type of the first mechanical part and a position of a critical area at the first mechanical part, wherein more than one life consumption calculation model is available for a same part and a same critical area;

determining a level of life consumption for the critical area of the first mechanical part based on the selected life consumption calculation model and the determined load history;

updating the plurality of life consumption calculation models after developing an improved model using available actual load sessions; and updating the level of life consumption with one of the updated life consumption calculation models.

2. The method of claim 1, wherein determining the level of life consumption for the critical area of the first mechanical part comprises applying the load history to the selected life consumption calculation model for calculating the level of life consumption.

3. The method of claim 2, wherein the selected life consumption calculation model is provided for calculation of at least one of stresses, strains or temperatures of the first mechanical component.

4. The method of claim 1, further comprising:
measuring a second set of operational data;
receiving the second set of data relating to the operation of the first mechanical part;
determining a plurality of steady state conditions for the second set of operational data;
determining a second load history for the first mechanical part for the plurality of determined steady states and the second set of operational data;
determining a life consumption for the critical area of the first mechanical part based on the selected life consumption calculation model and the determined load history;
accumulating the determined life consumptions for the first and second set of operational data for the critical area of the first mechanical part; and
providing a total level of life consumption for the critical area of the first mechanical part based on the accumulation.

5. The method of claim 1, further comprising correcting, based on the level of life consumption, a predefined life consumption prediction, the predefined life consumption prediction performed using a separate method for determining a level of life consumption of the critical area of the first mechanical part.

6. The method of claim 5, wherein the predefined life consumption prediction method is based on a load session cycle count.

7. The method of claim 5, wherein the predefined life consumption prediction method is based on at least one of measuring the usage time, run time or usage distance of the mechanical part.

8. The method of claim 1, wherein the plurality of predefined life consumption calculation models is represented by linear part-specific equations corresponding to general non-linear fatigue calculations models.

9. The method of claim 1, further comprising collecting the operational data during operation of a machine comprising the mechanical part.

10. The method of claim 1, wherein the first set of data relating to the operation of the first mechanical part comprises data generated by at least one sensor for measuring one of time, power lever angle, altitude, aircraft speed, ambient temperature, inlet temperature, low pressure rotor speed, high pressure rotor speed, combustor pressure, turbine outlet temperature, and turbine outlet pressure.

11. The method of claim 1, wherein determining the steady state conditions for the first set of operational data is performed by selecting said steady state conditions from a database comprising a plurality of steady state conditions, which each is configured for predetermined operational data.

12. The method of claim 1, wherein the life calculation consumption models are configured to match a predetermined behavior of the first mechanical part.

13. The method of claim 1, wherein the first mechanical part is subjected to life reducing load during operation, and the first set of operational data is received from a load session of the first mechanical part.

14. The method of claim 1, wherein the first mechanical part is formed by an aircraft component subjected to life reducing load during operation, and the first set of operational data is received from a load session of the first mechanical part.

15. A system comprising a database and a processing unit, wherein the processing unit is programmed to: measure a first set of operational data relating to the operation of a first mechanical part;
receive the first set of operational data relating to the operation of the first mechanical part;
determine a plurality of steady state conditions for the first set of operational data by matching measured data with corresponding predefined sets of parameter values;
determine a load history for the first mechanical part based on the plurality of determined steady states and the first set of operational data;
select one of a plurality of predefined life consumption calculation models based on the type of the first mechanical part and the position of the critical area at the first mechanical part, wherein more than one life consumption calculation model is available for a same part and a same critical area;
determine a level of life consumption for the critical area of the first mechanical part based on the selected life consumption calculation model and the determined load history;
update the plurality of life consumption calculation models after developing an improved model using available actual load sessions; and
update the level of life consumption with one of the updated life consumption calculation models.

16. The system of claim 15, wherein the processing unit is further programmed to:
measuring a second set of operational data;
receive the second set of data relating to the operation of the first mechanical part;
determine a plurality of steady state conditions for the second set of operational data;
determine a second load history for the first mechanical part for the plurality of determined steady states and the second set of operational data;
determine a life consumption for the critical area of the first mechanical part based on the selected life consumption calculation model and the determined load history;
accumulate the determined life consumptions for the first and second set of operational data for the critical area of the first mechanical part, and
provide a total level of life consumption for the critical area of the mechanical part based on the accumulation.

17. The system of claim 15, further comprising at least one sensor arranged in the vicinity of the mechanical part and configured for generation of the first set of operational data by measuring at least one of time, power lever angle, altitude, aircraft speed, ambient temperature, inlet temperature, low pressure rotor speed, high pressure rotor speed, combustor pressure, turbine outlet temperature, turbine outlet pressure.

18. The system of claim 15, wherein the steady state conditions are determined by selecting steady states matching specific sets of operational data from the database.

19. A non-transitory computer readable medium having stored thereon instructions executable by a computer processor, the instructions comprising instructions for: measuring a first set of operational data relating to the operation of a first mechanical part;

receiving the first set of data relating to the operation of the first mechanical part; determining a plurality of steady state conditions for the first set of operational data by matching measured data with corresponding predefined sets of parameter values;

determining a load history for the first mechanical part based on the plurality of determined steady states and the first set of operational data;

selecting one of a plurality of predefined life consumption calculation models based on the type of the first mechanical part and the position of the critical area at the first mechanical part, wherein more than one life consumption calculation model is available for a same part and a same critical area;

determining a level of life consumption for the critical area of the first mechanical part based on the selected life consumption calculation model and the determined load history;

updating the plurality of life consumption calculation models after developing an improved model using available actual load sessions; and updating the level of life consumption with one of the updated life consumption calculation models.

* * * * *